US 6,239,984 B1

(12) United States Patent
Koradia et al.

(10) Patent No.: US 6,239,984 B1
(45) Date of Patent: May 29, 2001

(54) BACKPLANE CIRCUIT BOARD FOR AN ELECTRONIC CHASSIS

(75) Inventors: Amir Koradia, Palatine; Philip A. Ravlin, Bartlett; Douglas J. Pogatetz, Arlington Heights; Gerald A. Greco, Elk Grove Village, all of IL (US)

(73) Assignee: 3Com Corporation, Rolling Meadows, IL (US)

( * ) Notice: Subject to any disclaimer, the term of this patent is extended or adjusted under 35 U.S.C. 154(b) by 0 days.

(21) Appl. No.: 09/372,489

(22) Filed: Aug. 12, 1999

(51) Int. Cl.[7] ...................................................... H05K 1/14
(52) U.S. Cl. .......................... 361/784; 361/788; 361/796; 361/686; 439/61; 439/59; 439/62; 174/261; 174/158 R
(58) Field of Search .................................... 361/784, 788, 361/746, 733, 803, 679, 686, 777; 439/61, 59, 62, 65, 74; 174/261, 158 R

(56) References Cited

U.S. PATENT DOCUMENTS

| 4,498,717 | * | 2/1985 | Reimer ............................ 339/17 LM |
| 5,023,754 | * | 6/1991 | Aug et al. .............................. 361/800 |
| 5,065,141 | * | 11/1991 | Whitsitt ................................ 340/635 |
| 5,173,845 | * | 12/1992 | Shaw ..................................... 361/798 |
| 5,289,340 | * | 2/1994 | Yoshifuji ............................... 361/695 |
| 5,398,161 | * | 3/1995 | Roy ....................................... 361/727 |
| 6,131,274 | * | 10/2000 | Koradis et al. ......................... 29/830 |
| 6,175,507 | * | 1/2001 | Koradis et al. ....................... 361/796 |

* cited by examiner

Primary Examiner—Albert W. Paladini
Assistant Examiner—David Foster
(74) Attorney, Agent, or Firm—Baniak Pine & Gannon

(57) ABSTRACT

A backplane circuit board for an electronic chassis includes a bracket and an upper circuit board operatively connected to the bracket. A lower circuit board is also operatively connected to the bracket wherein the upper circuit board is offset from the lower circuit board and the upper circuit board is parallel to the lower circuit board.

14 Claims, 3 Drawing Sheets

US 6,239,984 B1

BACKPLANE CIRCUIT BOARD FOR AN ELECTRONIC CHASSIS

FIELD OF THE INVENTION

This invention relates generally to the field of electronic chassis that house electronic components for high-speed telecommunication and networking applications and, in particular, to a backplane circuit board for an electronic chassis.

BACKGROUND OF THE INVENTION

An electronic chassis which houses electronic components for high speed telecommunication and networking applications typically includes a plurality of vertically oriented circuit board assemblies, each of which are typically comprised of a circuit board attached to a U-shaped bracket member. These circuit boards are typically referred to as application cards. The application cards are inserted into the chassis and are guided into the chassis along a pair of card guide assemblies mounted between the side walls of the chassis. One of the card guide assemblies is typically located adjacent the top of the chassis and the other is typically located adjacent the bottom of the chassis.

A backplane circuit board having various surface mounted connectors is typically fastened to the pair of card guide assemblies and forms the back wall of the chassis. When fully inserted into the chassis, connectors located along the back edge of the application cards are connected to the connectors located on the backplane circuit board.

Conventional backplane circuit boards are typically comprised of a single circuit board. The top section of conventional backplane circuit boards typically includes a plurality of surface mounted connectors that provide electrical connections between the various application cards within the chassis. These connectors are not double-sided and therefore do not extend through the circuit board to the backside of the circuit board. The bottom section of conventional backplane circuit boards typically includes a plurality of telephone connectors have double sided telephone connectors that have an input on one side of the circuit board and output on the other. Input cables from outside of the chassis are connected to the telephone connectors on the backside of the circuit board.

There are several disadvantages to this arrangement. Conventional backplanes have to be moved away from the back portion of the chassis, toward the front of the chassis, in order to accommodate the double-sided telephone connectors that project outward on both sides of the backplane circuit board. This takes up a considerable amount of space within the chassis, which has strict dimensional requirements. For example, conventional electronic chassis must typically maintain a depth of 11.811 inches.

The placement of conventional backplanes also has a negative impact of the application cards within the chassis. For example, the placement of a conventional backplane typically limits the size of the application cards located within the chassis. This in turn limits the amount of space available on the applications cards for various electronic functions.

Accordingly, it would be desirable to have a backplane circuit board that overcomes the disadvantages described above.

SUMMARY OF THE INVENTION

One aspect of the invention provides a backplane circuit board for an electronic chassis including bracket and an upper circuit board operatively connected to the bracket. A lower circuit board is operatively connected to the bracket wherein the upper circuit board is offset from the lower circuit board and the upper circuit board is parallel to the lower circuit board. The bracket may preferably include a body portion, a first flange portion, and a second flange portion. The upper circuit board may preferably be operatively attached to the first flange portion and the lower circuit board may be attached to the second flange portion. The first flange portion may preferably include a plurality of openings to allow the upper circuit board to be attached to the first flange portion. Similarly, the second flange portion may preferably include a plurality of openings to allow the lower circuit board to be attached to the second flange portion. The upper circuit board may preferably be substantially parallel to lower circuit board. The bracket may preferably include a first end and a second end. A first plate member may preferably be positioned at the first end of the bracket and a second plate member may preferably be positioned at the second end of the bracket. The first and second plate members may preferably each include at least one opening to allow the first and second plate members to be fastened to the electronic chassis. The upper circuit board may preferably include a plurality of openings to allow the upper circuit board to be fastened to the electronic chassis. The lower circuit board may preferably include a plurality of openings to allow the lower circuit board to be fastened to the electronic chassis. A plurality of telephone connectors may preferably be mounted to the lower circuit board and a plurality of connectors may preferably be mounted to the upper circuit board.

Another aspect of the invention provides a backplane circuit board for an electronic chassis including a bracket mounted to the electronic chassis. An upper circuit board is mounted to the electronic chassis and is operatively connected to the bracket. A lower circuit board is mounted to the electronic chassis and is operatively connected to the bracket wherein the upper circuit board is offset from the lower circuit board and the upper circuit board is parallel to the lower circuit board.

Another aspect of the invention provides a method of assembling a backplane circuit board. A bracket, an upper circuit board operatively connected to the bracket, and a lower circuit board operatively connected to the bracket is provided. The upper circuit board is offset from the lower circuit board, and the upper circuit board is positioned in parallel to the lower circuit board.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 1 also shows an application card mounted to the backplane circuit board;

DETAILED DESCRIPTION OF THE PRESENTLY PREFERRED EMBODIMENTS

Figure 1:
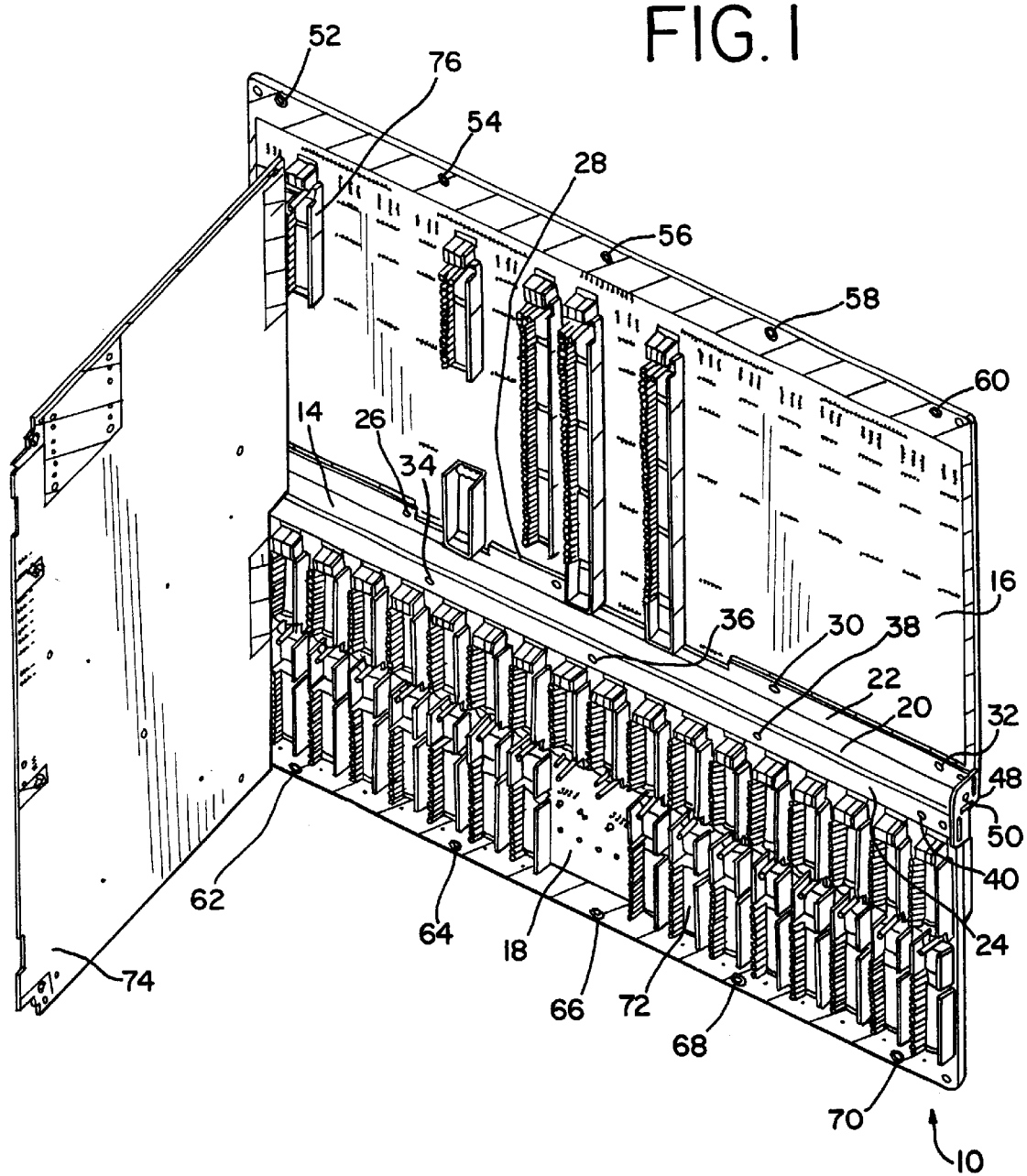
FIG. 1 is a perspective view of a preferred embodiment of a backplane circuit board that is made in accordance with the invention.

As shown in FIG. 1, a preferred embodiment of a backplane circuit board 10 for an electronic chassis electronic chassis 12 (see FIGS. 2–3) includes a bracket 14, an upper circuit board 16 operatively connected to the bracket 14, and a lower circuit board 18 that is also operatively connected to the bracket 14. The upper circuit board 16 is offset from the lower circuit board 18 and the upper circuit board 16 is parallel to the lower circuit board 18. In the embodiment shown in FIGS. 2–3, the backplane circuit board 10 is adapted to be positioned along a back portion of the electronic chassis 12, and once installed, forms a back wall of the electronic chassis 12. The electronic chassis 12 may preferably be any suitable enclosure for housing various electronic components, and may preferably be comprised of steel, aluminum or any other suitable metallic material.

Referring to FIG. 1, the bracket 14 may preferably include a body portion 20, a first flange portion 22, and a second flange portion 24. In the embodiment shown, the upper circuit board 16 may preferably be operatively attached to the first flange portion 22 and the lower circuit board 18 may preferably be attached to the second flange portion 24. The bracket 14 may preferably extend the entire width of both the upper circuit board 16 and the lower circuit board 18. In the embodiment shown, the bracket 14 may preferably have a step configuration, with the first flange portion 22 being offset from the second flange portion 24. The first flange portion 22 is preferably parallel to the second flange portion 24 so that when the upper circuit board 16 is attached to the first flange portion 22, and the lower circuit board 18 is attached to the second flange portion 24, the upper circuit board 16 and the lower circuit board 18 are offset from one another and are parallel to one another. Alternatively, the upper circuit board 16 may preferably be substantially parallel to lower circuit board 18. The bracket 14 may preferably be formed from a single piece of rigid material such as, for example, metal or plastic.

The first flange portion 22 of the bracket 14 may preferably include a plurality of openings 26, 28, 30, and 32 spaced apart along the length of the first flange portion 22 to allow the upper circuit board 16 to be attached to the first flange portion 22. Similarly, the second flange portion 24 may preferably include a plurality of openings 34, 36, 38, 40 spaced apart along the length of the second flange portion 24 to allow the lower circuit board 18 to be attached to the second flange portion 24. The upper and lower circuit boards 16,18 may preferably be attached to the first and second flange portions 22, 24, respectively with conventional fasteners such as, for example, screws or bolts.

Figure 2:
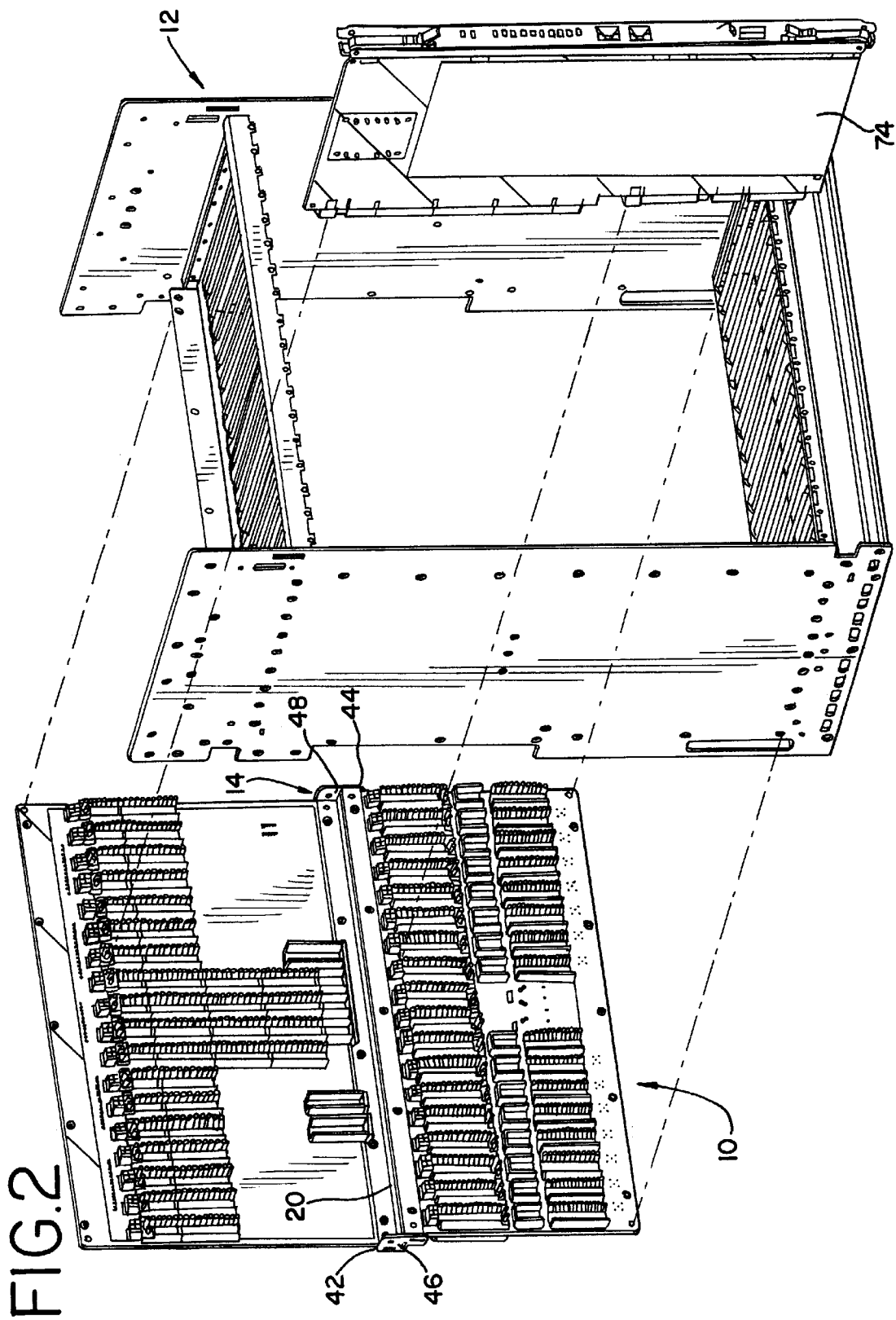
FIG. 2 is an exploded perspective view of the backplane circuit board, an electronic chassis, and an application card.
Figure 3:
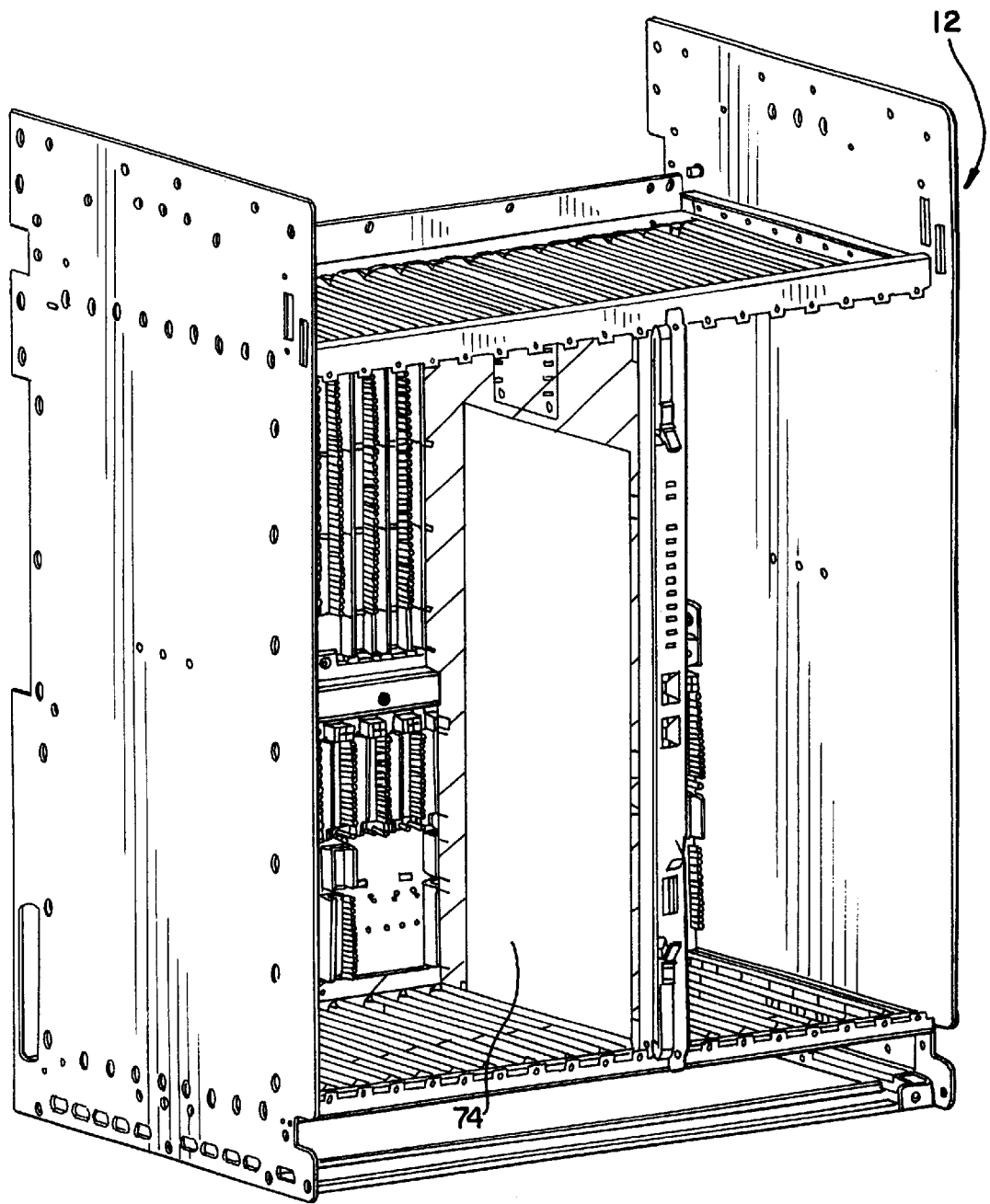
FIG. 3 is an assembled view of the backplane circuit board, electronic chassis, and application card shown in FIG. 2.

As shown in FIGS. 1–2, the bracket 14 includes a first end 42 and a second end 44. A first plate member 46 is positioned at the first end 42 of the bracket 14 and a second plate member 48 is positioned at the second end 44 of the bracket 14. The first and second plate members 46, 48 ensure that the backplane circuit board 10 is properly aligned with respect to the electronic chassis 12. This in turn ensures that the plurality of application cards (such as application card 74) properly connects with the backplane circuit board 10. The first and second plate members 46, 48 may preferably each include at least one opening 50 (see FIG. 1) to allow the first and second plate members 46, 48 to be fastened to the electronic chassis 12. In the embodiment shown, the first and second plate members 46, 48 each extend from the body portion 20 of the bracket 14. The first and second plate members 46, 48 may each be fastened to the body portion 20 of the bracket 14 in any conventional manner. For example, the first and second plate members 46, 48 may each be spot welded to the body portion 20. Alternatively, the first and second plate members 46, 48 may each preferably be attached to the body portion 20 with conventional fasteners such as, for example, screws or bolts.

Referring again to FIG. 1, the upper circuit board 16 may preferably include a plurality of openings 52, 54, 56, 58, 60 to allow the upper circuit board 16 to be fastened to the electronic chassis 12. Similarly, the lower circuit board 18 includes a plurality of openings 62, 64, 66, 68, 70 to allow the lower circuit board 18 to be fastened to the electronic chassis 12. The upper and lower circuit boards 16, 18 may preferably be attached to the electronic chassis 12 with conventional fasteners such as, for example, screws or bolts. The upper circuit board 16 and the lower circuit board 18 may preferably be any conventional printed circuit boards. The upper and lower circuit boards 16 and 18 may also preferably be adapted to receive a plurality of application cards (such as application card 74) that are positioned within the electronic chassis 12. The application cards may preferably be any conventional printed circuit boards that are adapted carry out various electronic functions.

A plurality of telephone connectors such as telephone connector 72 may preferably be mounted to the lower circuit board 18. The telephone connector 72 may preferably be a double-sided telephone connector that has an input terminal on one side of the lower circuit board 18 and an output terminal on the other side of the lower circuit board 18. In the embodiment shown in FIG. 1, the telephone connector 72 receives corresponding connectors located along the bottom back edge of an application card such as application card 74. A plurality of connectors such as connector 76 is mounted to the upper circuit board 16. In the embodiment shown, the plurality of connectors receives corresponding connectors located along the top back edge of an application card such as application card 74.

One advantage of the backplane circuit board 10 described above is that it maximizes that space within the electronic chassis 12, which typically has strict depth requirements. Offsetting the upper circuit board 16 from the lower circuit board 18 provides the necessary space for the telephone connectors 72 mounted to the lower circuit board 18, and yet maximizes the space within the chassis 12 above the lower circuit board 18. For example, offsetting the upper circuit board 16 from the lower circuit board 18 provides more space on the top portion of the application card 74 for various electronic functions.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A backplane circuit board for an electronic chassis comprising:
   a bracket, an upper circuit board operatively connected to the racket, and a lower circuit board operatively connected to the bracket herein the upper circuit board is offset from the lower circuit board and the upper circuit board is parallel to the lower circuit board.

2. The apparatus of claim 1 wherein the bracket includes a body portion, a first flange portion, and a second flange portion.

3. The apparatus of claim 2 wherein upper circuit board is operatively attached to the first flange portion and the lower circuit board is attached to the second flange portion.

4. The apparatus of claim 3 wherein the first flange portion includes a plurality of openings to allow the upper circuit board to be attached to the first flange portion.

5. The apparatus of claim 3 wherein the second flange portion includes a plurality of openings to allow the lower circuit board to be attached to the second flange portion.

6. The apparatus of claim 1 wherein the upper circuit board is substantially parallel to lower circuit board.

7. The apparatus of claim 1 wherein the bracket includes a first end and a second end, a first plate member positioned at the first end of the bracket and a second plate member positioned at the second end of the bracket.

8. The apparatus of claim 7 wherein the first and second plate members each include at least one opening to allow the first and second plate members to be fastened to the electronic chassis.

9. The apparatus of claim 1 wherein the upper circuit board includes a plurality of openings to allow the upper circuit board to be fastened to the electronic chassis.

10. The apparatus of claim 1 wherein the lower circuit board includes a plurality of openings to allow the lower circuit board to be fastened to the electronic chassis.

11. The apparatus of claim 1 further comprising a plurality of telephone connectors mounted to the lower circuit board.

12. The apparatus of claim 1 further comprising a plurality of connectors mounted to the upper circuit board.

13. A backplane circuit board for an electronic chassis comprising:

a bracket mounted to the electronic chassis, an upper circuit board mounted to the electronic chassis and operatively connected to the bracket, a lower circuit board mounted to the electronic chassis and operatively connected to the bracket wherein the upper circuit board is offset from the lower circuit board and the upper circuit board is parallel to the lower circuit board.

14. A method of assembling a backplane circuit board comprising:

providing a bracket, an upper circuit board operatively connected to the bracket, a lower circuit board operatively connected to the bracket;

offsetting the upper circuit board from the lower circuit board; and positioning the upper circuit board in parallel to the lower circuit board.

* * * * *

UNITED STATES PATENT AND TRADEMARK OFFICE
CERTIFICATE OF CORRECTION

PATENT NO.   : 6,239,984 B1
DATED        : May 29, 2001
INVENTOR(S)  : Amir Koradia, Philip A. Ravlin and Gerald A. Greco It is certified that error appears in the above-identified patent and that said Letters Patent is hereby corrected as shown below:

<u>Column 4,</u>
Line 61, please change the phrase "the racket" to -- the bracket --.
Line 62, please change the phrase "the bracket herein" to -- the brracket wherein --.

Signed and Sealed this

Sixth Day of May, 2003

JAMES E. ROGAN
*Director of the United States Patent and Trademark Office*